(12) United States Patent
Haddad et al.

(10) Patent No.: US 6,526,562 B1
(45) Date of Patent: Feb. 25, 2003

(54) METHODS FOR DEVELOPING AN INTEGRATED CIRCUIT CHIP DESIGN

(75) Inventors: Elie Haddad, Austin, TX (US); James Monaco, Austin, TX (US); Thomas Tomazin, Austin, TX (US); William C. Anderson, Austin, TX (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/568,398

(22) Filed: May 10, 2000

Related U.S. Application Data

(60) Provisional application No. 60/133,293, filed on May 10, 1999.

(51) Int. Cl.[7] .............................................. G06F 17/50
(52) U.S. Cl. ............................................ 716/18; 716/1
(58) Field of Search ............................... 716/5; 11/4, 3, 11/1, 18

(56) References Cited

U.S. PATENT DOCUMENTS 6,321,329 B1 * 11/2001 Jaggar et al. ................ 712/227
6,343,358 B1 * 1/2002 Jagger et al. ................ 712/227

OTHER PUBLICATIONS

Onder et al, "Automatic Generation Of Micriarchitecture Simulators," IEEE, May 14, 1998, pp. 1–10.*
Biswas et al, "Funtional Verification Of The Superscalar SH–4 Microprocessor," IEEE, 1997, pp. 115–120.*
Bechem et al, "An Integrated Functional Performance Simulator," IEEE, Jun. 1999, pp. 26–35.*
Shen et al, "Using Term Rewriting Systems To Design And Verify Processors," IEEE, Jun. 1999, pp. 36–46.*

* cited by examiner

Primary Examiner—Vuthe Siek
(74) Attorney, Agent, or Firm—Wolf, Greenfield & Sacks, P.C.

(57) ABSTRACT

A method for developing an integrated circuit chip design includes the steps of developing an architecture specification defining the functions of the chip, developing a microarchitecture specification based on the architecture specification, developing a functional and structural model of the chip based on the microarchitecture specification, designing software tools for use with the chip based on the architecture specification, and designing chip verification tools based on the microarchitecture specification. The activities associated with chip development are divided into phases which may be performed concurrently. The result of the development is an RTL model of the chip which can be utilized in implementation of products without comprising proprietary circuit, layout and fabrication process information of the entity that is implementing the products.

17 Claims, 4 Drawing Sheets

METHODS FOR DEVELOPING AN INTEGRATED CIRCUIT CHIP DESIGN

CROSS-REFERENCE TO RELATED APPLICATION

This application claims the benefit of provisional application Ser. No. 60/133,293, filed May 10, 1999, which is hereby incorporated by reference.

FIELD OF THE INVENTION

This invention relates to processes for developing an integrated circuit design, including the development of a chip model, chip verification tools and application software.

BACKGROUND OF THE INVENTION

Current very-large-scale integrated circuits, such as central processing units (CPUs) and digital signal processors (DSPs), have extremely high complexity and extremely high operating speeds. For example, current chips may incorporate on the order of 30 million devices and may operate at speeds on the order of 1 GHz or greater. Trends in such chips are toward even greater complexities and higher operating speeds. Additional trends are toward smaller device features and larger chip areas. As may be expected, the functionality of such chips is also extremely complex.

Not surprisingly, the development of such integrated circuits is also extremely complex and may involve a large team of architects and chip developers. The development of the chip itself involves specifying the detailed functions to be performed, defining an instruction set, addressing issues of floor-planning and layout, addressing signal timing issues, and addressing power consumption issues, to name only a few. The development also involves designing software tools, such as assemblers, linkers, and the like, for use with the chip, and designing verification tools that permit the functioning of the chip to be verified. In the case of such complex chips, verification may involve billions of distinct states. The chip is typically modeled in software to permit design verification and simulation. The software model is then utilized to produce a chip layout. The coordination of these activities is extremely complex and, if done improperly or inefficiently, can result in a lengthy development process and/or an unsuccessful product.

In some cases, the development of integrated circuits is a joint effort by two or more companies. The result of the joint development effort is a chip design which can be utilized by each company in different products. However, in the case where each company is involved in the development and manufacturing of integrated circuits, each company is likely to have processes, designs and other information which it considers to be proprietary. In this situation, it is desirable to organize the chip development effort in a manner which produces the desired chip design but which does not compromise the proprietary information of the participating companies.

In some cases, the chip design may be utilized as a component in a larger integrated circuit, such as a system on a chip (SOC). For example, the chip design may represent a computation core which can be incorporated into a digital signal processor or into a special purpose chip. In this situation, the chip design preferably is in a form which is easily incorporated into the design of the SOC.

Accordingly, there is a need for methods for developing integrated circuits in an efficient and cost effective manner.

SUMMARY OF THE INVENTION

According to a first aspect of the invention, a method is provided for developing an integrated circuit chip design. The method comprises the steps of (a) developing an architecture specification defining functions of the chip, (b) developing a microarchitecture specification for the chip based on the architecture specification, (c) developing a functional and structural model of the chip based on the microarchitecture specification, (d) designing software tools for use with the chip based on the architecture specification, (e) designing chip verification tools based on the microarchitecture specification, and (f) performing steps (c), (d) and (e) concurrently.

Each of steps (c), (d) and (e) may include a planning phase, a building block development phase and an execution phase. Each of the phases may have defined dependencies and defined deliverables.

The method may further include the step of developing an information database containing information on the development of the chip. The information database may include project tracking information and revision control information, and may be web-based for access by team members.

The chip verification tools may be used to verify the functional and structural model of the chip. The chip verification tools may be used iteratively following modifications to the functional and structural model of the chip. A chip layout may be synthesized to assist in developing the functional and structural model of the chip.

According to another aspect of the invention, a method is provided for developing an integrated circuit chip. The method comprises the steps of developing a chip model defining the functional and structural characteristics of the chip using information shared by first and second development entities, and implementing a chip design based on the chip model and using process and layout information which is proprietary to the first development entity and which is not shared with the second development entity.

BRIEF DESCRIPTION OF THE DRAWINGS

For a better understanding of the present invention, reference is made to the accompanying drawings, which are incorporated herein by reference and in which.

DETAILED DESCRIPTION

Figure 1A:
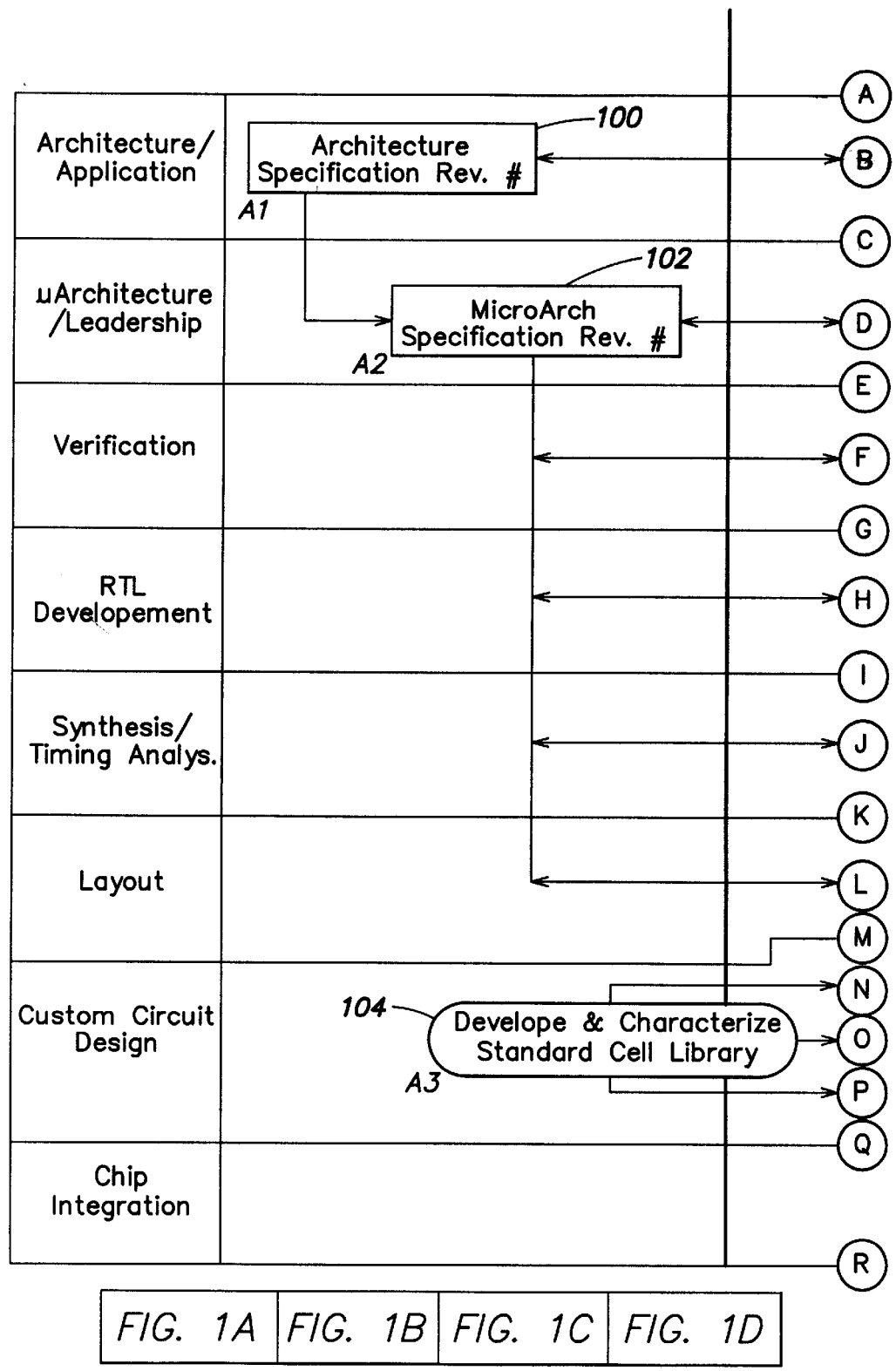
FIGS. 1A–1D show a flow diagram of a process for developing an integrated circuit chip in accordance with an embodiment of the invention.
Figure 1B:
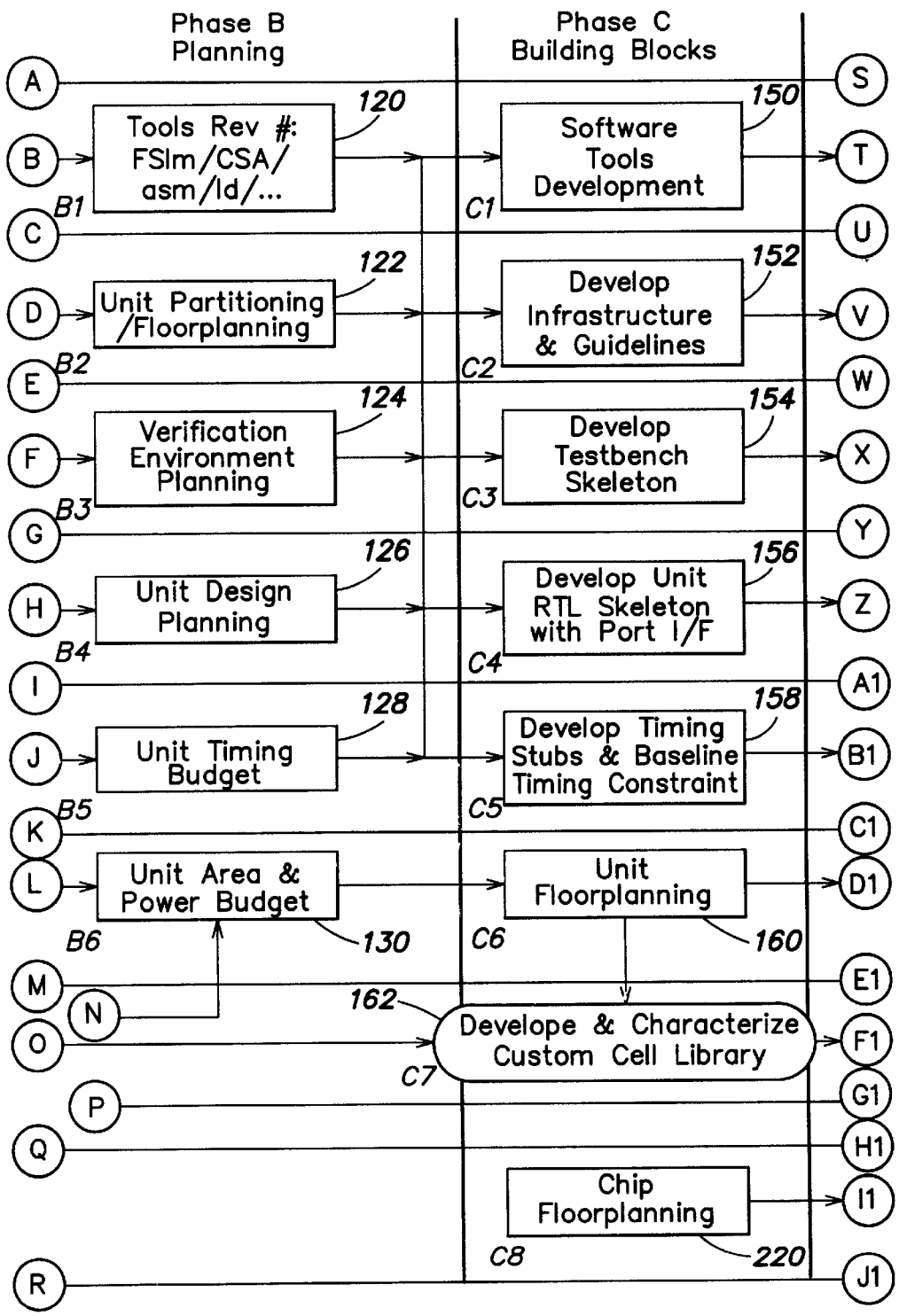
Figure 1C:
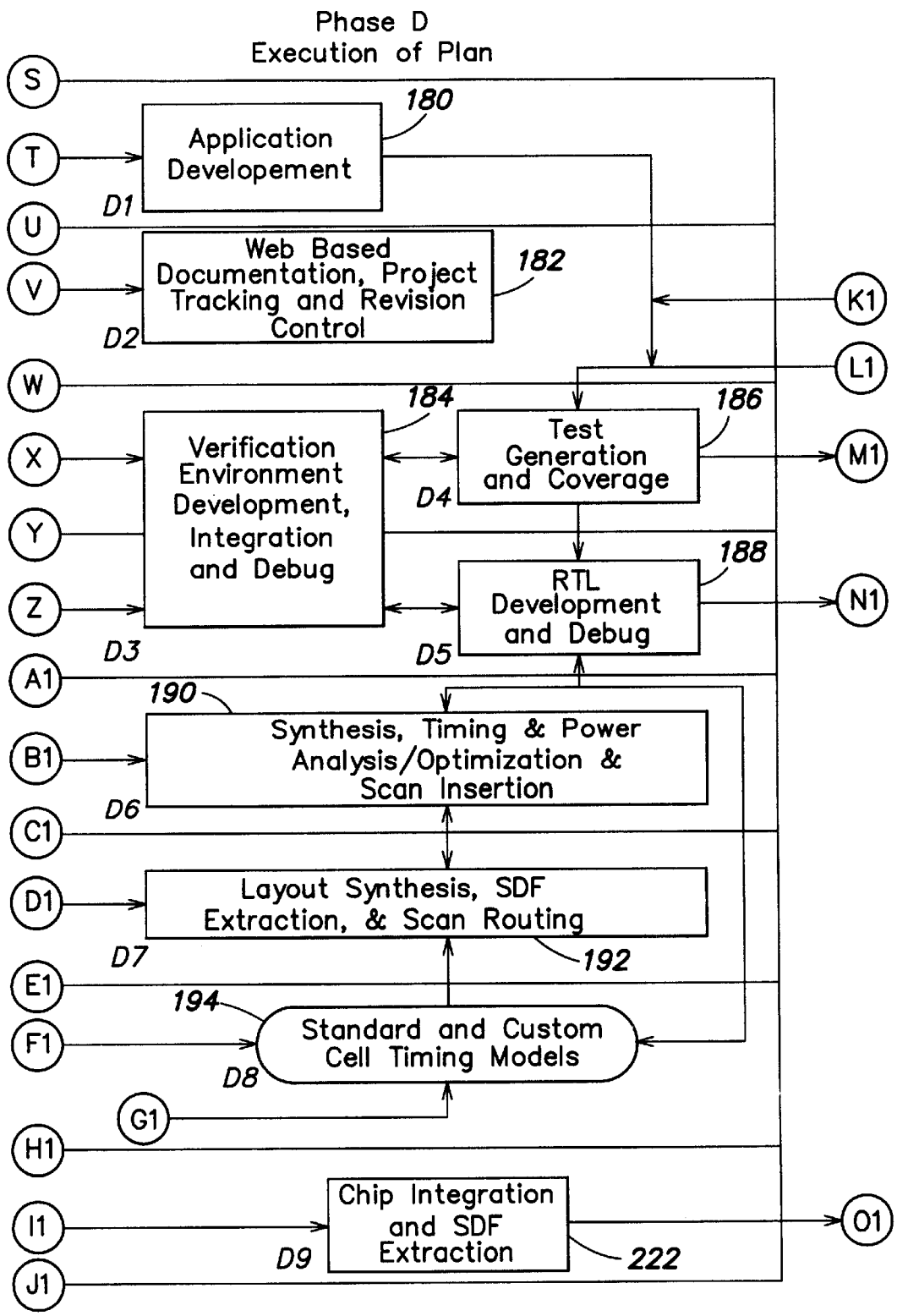
Figure 1D:
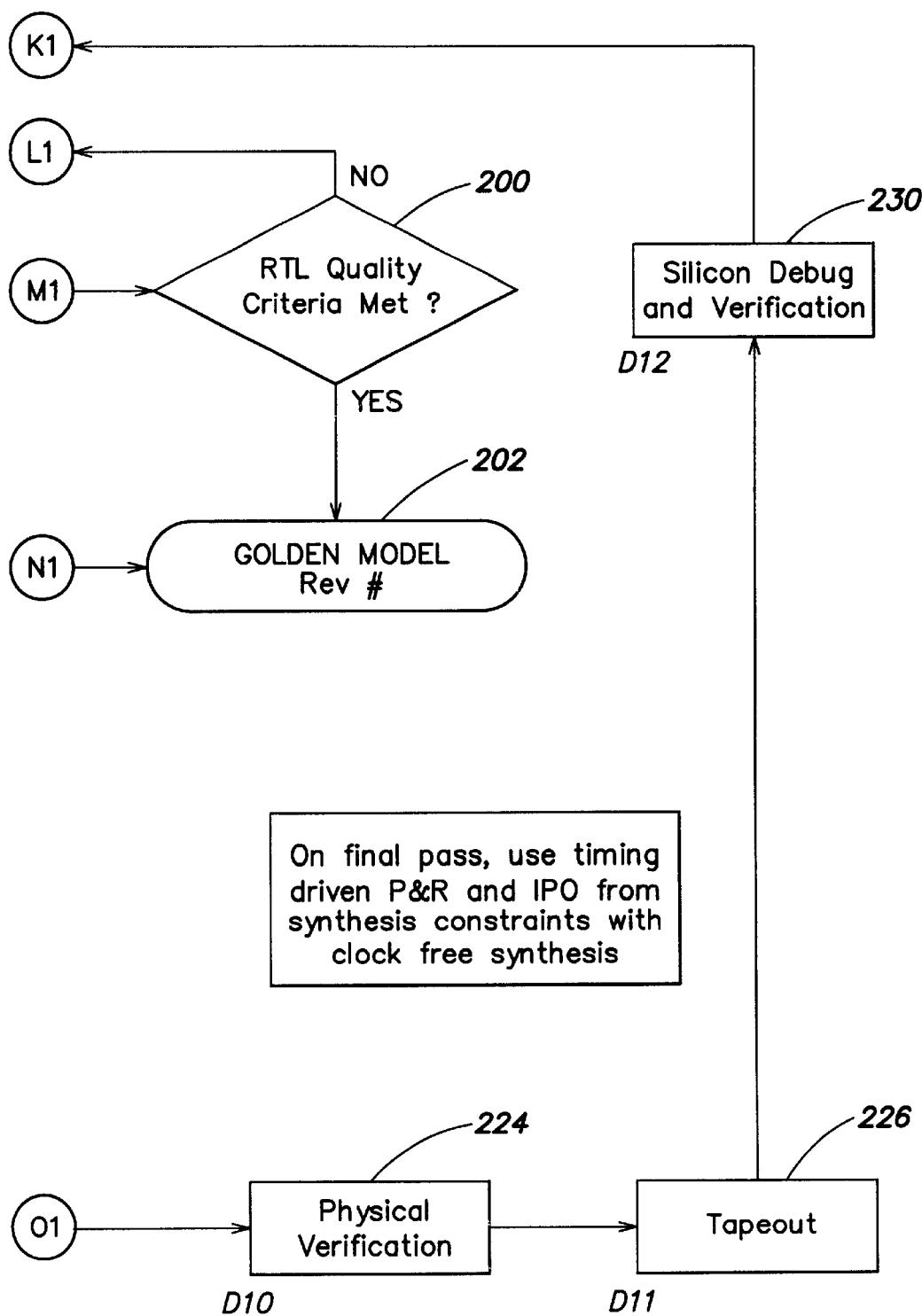

The present invention provides methods for the development of integrated circuit chips. A flow chart of an embodiment of a method for integrated circuit chip development in accordance with the invention is shown in FIGS. 1A–1D. The chip development process includes phases, each of which is shown in a vertical column in FIGS. 1A–1D. The activities within each phase preferably occur concurrently, and different phases preferably occur at different times, with time progressing from left to right in FIGS. 1A–1D. Phase A relates to development of architectural and microarchitectural specifications, phase B relates to planning based on the architectural specifications, phase C involves development of building blocks to be used in the chip development process based on the results of the planning phase, and phase D involves execution of the plan developed in phases A, B and C to produce a chip design in the form of a software model of the chip.

Horizontal rows in FIGS. 1A–1D represent different major activities in the chip development process. Activities include architecture/application development, microarchitecture development and leadership, chip verification, chip model development, synthesis and timing analysis, chip layout, custom circuit design and chip integration. Specific activities within each major activity and phase are represented by blocks, and lines interconnecting the blocks represent dependencies between activities. The chip development process shown in FIGS. 1A–1D and described herein defines the dependencies and deliverables of each block, so that each team working on the development project knows what it will receive from a previous block and what it is responsible for delivering to the next block in the development process.

The architectural specification phase, phase A, includes architecture specification block 100, microarchitecture specification block 102 and standard cell library block 104. The architecture specification of block 100 is developed by the architecture team and includes a high level system specification of the basic functions of the chip, its software and its instruction set. The architecture specification typically does not indicate how functions of the chip are to be implemented. Deliverables may include an architecture document, a cycle simulator, an assembler/disassembler, a linker/loader and a compliance test suite. The architecture specification is likely to undergo a series of revisions, each of which is assigned a revision level. The architecture specification block 100 supplies deliverables to microarchitecture specification block 102 and to software development block 120.

The microarchitecture specification block 102 involves lower level architectural planning of the chip and involves defining the units within the chip, such as adders, multipliers, instruction sequencers, etc., and the interfaces between units. The microarchitecture specification is typically developed by the implementation team with feedback from the architecture team and the verification team and may include a standard unit design document template. The design document template may include information such as block diagrams, timing diagrams, a floor plan, verification and testability plans, coverage assessment, area, speed and power estimates and budgets, manpower estimates and a schedule, as well as any special requirements and issues. Deliverables may include a microarchitecture document, a preliminary definition of unit interfaces and a verifiability assessment.

Standard cell library block 104 involves development of a library of standard logic components and macros. A written description of the library components and macros and size-less schematics are utilized to communicate the necessary information to the circuit design team. The library may be developed jointly and may be characterized to generate necessary timing models and files needed for synthesis and other activities required to deliver a quality chip model, as described below. The chip model is optimized for area, speed and power based on the standard cell library. The standard cell library may be developed by the custom circuit design team and may have as deliverables a standard cell and macros library, including schematics, cell models, characterization data and models, suitable for synthesis and place and route functions. As shown in FIGS. 1A–1D, standard cell library block 104 may continue into phase B.

The planning phase, phase B, includes software tools block 120, partitioning and floorplanning block 122, verification environment planning block 124, unit design planning block 126, unit timing budget block 128, and unit area and power budget block 130. The activities in the planning blocks preferably occur concurrently and depend on information contained in the architecture specification and the microarchitecture specification.

The software tools block 120 involves refinement of the prototype software development tools which were developed as part of the architecture specification. The software tools block 120 may be the responsibility of the software development team and the architecture team, and may have as deliverables a functional/cycle simulator, an assembler/disassembler and a linker/loader, all of which are refinements of the tools developed during the development of the architecture specification.

Partitioning and floorplanning block 122 involves partitioning the chip into units using the design document template from microarchitecture specification block 102 and documentation of the unit interfaces, timing diagrams, block diagrams and preliminary chip floorplanning. The partitioning and floorplanning block 122 may be the responsibility of the implementation team and may have as deliverables a refined unit design document template according to the microarchitecture specification.

Verification environment planning block 124 involves generation of a set of test plans and guiding principles for producing a range of test cases needed to verify correct implementation of the architectural specification and to support product engineering. Specific activities include extracting function points and independent modes by unit, determining the extent of DFT (Design For Testability) support for product/test engineering, constructing DFT test plans, defining a standard compliance test suite, constructing an architectural feature coverage matrix and constructing unit test plans. Additional activities include determining boundaries of handcrafted versus automated and directed versus random test development effort, identifying required chip and unit monitors and checkers, establishing architectural coverage goals, establishing chip model coverage goals and establishing simulation cycle goals. The verification environment planning block 124 may be the responsibility of the verification team and the implementation team and may have as deliverables verification plans, testability plans and guidelines. Some or all of this information can be posted on the chip development web site, as described below.

The unit design planning block 126, the unit timing budget block 128 and the unit area power budget block 130 involve refinement of the microarchitecture and unit design document by the implementation team with verification team feedback. Unit designers review the microarchitecture specification and guidelines and perform necessary feasibility studies to refine unit level microarchitecture documentation. Specific activities include review and refinement of floorplans and area estimates, development of design budgets for timing, power and area, refining the functional description, identification of critical paths, documenting timing diagrams, and identifying and documenting issues and concerns. Additional activities include using the verification requirements format and guidelines for architecture and microarchitecture verification and coverage assessment, and starting revision control of baseline timing constraints for synthesis, unit level interface specifications and microarchitecture specifications. The microarchitecture specification is reviewed and, upon approval, is posted on the chip development web site, as described below. Deliverables include a revised microarchitecture and unit design document for all units.

It may be noted that the outputs of planning blocks 120, 122, 124, 126 and 128 are connected together and are connected to the respective blocks in phase C. This indicates that the deliverables from the different planning blocks may be utilized by any of the blocks in phase C. It will be understood that some or all of the blocks in the flow diagram may be iterative in nature and may involve feedback to and revision of one or more previous blocks.

The phase C development of building blocks includes software tools development block 150, infrastructure and guidelines block 152, test bench skeleton block 154, unit RTL skeleton block 156, timing constraint block 158, unit floorplanning block 160 and custom cell library block 162. In general, phase C involves software tool development, development of chip infrastructure, development of verification and chip model frameworks, and timing and floorplanning development.

Software tools development block 150 may be performed by the software tools development team and may produce as deliverables the cycle simulator, the assembler/deassembler, the linker/loader, and a compiler. In addition, the software tools development block 150 produces hardware design/plans to match the verification testbench for silicon debugging and scan debug system design plans for silicon debugging in the laboratory.

Infrastructure and guidelines block 152 involves the use of plans and priorities to develop a web-based project tracking system at the unit and chip levels. The web-based database and information display system may include information concerning simulation progress, failure status, problem tracking, defect rate tracking, a distributed simulation and design job control system. In addition, the web-based display system may include architecture coverage status, chip model coverage status, performance status, frequency status, size status, estimated power consumption status, test case generation flows, and the like. The database and display system may provide both summary information, such as graphical representations, for management use, and detailed information for use by members of the development team. The infrastructure and guidelines block 152 may be developed by the project management team, such as senior design and verification engineers, and may provide as deliverables a web-based information system for progress tracking and information dissemination. The information system may provide guidelines for changing the chip model, as well as revision control and the ability to review a revision history.

The testbench skeleton block 154 involves development of a skeleton, or framework, of software for testing and verifying the chip model. The testbench begins as a preliminary environment for basic sequencing support to assist in accelerating development of other units. The testbench environment then evolves to mimic a system environment, such as by receiving and processing data and control signals output by the chip, producing external stimuli, etc. The testbench environment loads programs and test stimuli and controls the simulation environment. The testbench is capable of presenting the pass/fail status of simulated test cases. The testbench skeleton block 154 may be the responsibility of the verification team and the chip model team and provides as deliverables a testbench framework for chip model simulation and an initial verification environment.

The RTL (register transfer language) skeleton block 156 involves establishing a configuration control system and model promotion method. The chip model, or RTL model, is a software description of the chip including inputs, outputs and all components, such as gates, registers, adders, etc., and the interrelationships between components to form a complete chip. The chip model can be executed in a simulator to verify functionality and can be converted to various forms such as a schematic, a netlist or a text description. The chip model is used as the basis for layout and implementation of the chip in silicon. The RTL skeleton block 156 may be the responsibility of the implementation team and may have as deliverables an initial or preliminary chip model under revision control and a definition of unit interfaces in the chip model consistent with the microarchitecture specification.

Timing constraint block 158 involves use of the architecture specification, the microarchitecture specification and the results of feasibility studies to refine initial timing requirements provided from timing budget block 128. The timing models and constraints may be scripts and guidelines for use with known synthesis tools. The timing constraint block 158 may be the responsibility of the implementation team and may provide as deliverables initial unit timing models and constraint files.

Unit floorplanning block 160 involves further refining the initial floorplanning from partitioning and floorplanning block 122 and the unit area and power budget developed in block 130. Unit floorplanning block 160 may be the responsibility of the implementation team and may provide as deliverables bounding boxes for chip level floorplanning, and may include updating the timing and power estimates in the microarchitecture specification.

The custom cell library block 162 involves development and characterization of custom cells that may be required for the chip design. The development and characterization of the custom cell library may be the responsibility of a custom circuit design team and may provide as deliverables custom cell models, including custom cell area, timing and power characterization data, as well as layout views.

Phase D of the chip development process involves execution of the design and verification plans developed in phase C. Phase D includes application development block 180, web-based documentation block 182, verification block 184, test generation block 186, RTL development and debug block 188, logic synthesis block 190, layout synthesis block 192 and cell timing models block 194.

Application development block 180 involves the development of application software for the chip and may be the responsibility of the architecture, applications, marketing and software tools team.

The web-based documentation block 182 involves utilizing databases and the web-based information system developed in block 152 to provide information, such as daily, weekly and/or monthly quality and progress reports, to collect and publish documentation on the web site and to collect design quality data at regular intervals and to display such quality data in appropriate formats for different audiences. As described above, graphs and summaries may be provided for management, and detailed information may be provided for development team members. The web-based documentation block 182 may be the responsibility of the architecture, applications, marketing, and software tools teams and may provide as deliverables web pages containing project documentation and progress data, and any other information pertaining to the project.

Verification block 184 involves development, integration and debugging of the verification and testability environment. The process involves simulation wrapper scripts and interfaces with the web-based documentation system. The verification and testability environment is preferably the responsibility of the verification team and the chip model team. Failures are investigated and resolved according to the cause of the problem. Tests are created and executed through simulation using the testbench skeleton developed in block 154. Test generation is conducted through a combination of manual and automated methods. The verification environment should be flexible enough to support both design and production test case functions, such as full scan and boundary scan simulations.

The test generation block 186 involves using the architectural and unit test plans developed in blocks 124 and 126 to generate, execute and evaluate tests. Unit regression suites should be maintained for unit development. A system regression suite may include a combination of all unit cases plus random tests contributing to chip model coverage or having uncovered failures, plus available benchmark suites. Performance and standards compliance verification should be established early in the implementation process and should be performed regularly as model revisions are completed. RTL coverage should be integrated early in the development process and updated at regular intervals. Directed tests should be supplemented with near continuous automated, random test case generation and simulation. All test cases should go under revision control. When quality criteria are met, final synthesis and transfer to the product implementation team can begin. The test generation block 186 may be the responsibility of the verification team and the RTL team and may provide as deliverables a test suite to verify that the RTL code meets the quality criteria.

RTL development and debug block 188 involves successive refinement of the RTL model according to the microarchitecture specification from block 102 and unit plans from block 126, while using the configuration control and model promotion methods devised and implemented in blocks 156 and 184. It should be noted that even after handoff of the final RTL model to the product implementation team, test case generation and execution may continue to seek problems and to communicate any newly discovered problems or specification clarifications. RTL development and debug block 188 may be the responsibility of the RTL implementation team and may provide as a deliverable an RTL model that meets the quality criteria.

Logic synthesis block 190 is part of an iterative process flow including blocks 188, 190 and 192. When an RTL model is checked into the revision control system, the RTL is synthesized to a more refined set of timing constraints, and a netlist is produced to hand off to the layout generation process of block 192. Standard delay file (SDF) data is generated in the layout process of block 192 to feed back to the logic synthesis block 190 in order to perform additional optimization based on physical constraints. The logic synthesis block 190 requires the standard and custom cell timing models from block 194. The logic synthesis block 190 may be the responsibility of the RTL team and the synthesis team and may provide as deliverables RTL models that meet the testability, frequency, power and area goals of the design.

The layout synthesis block 192 synthesizes a chip layout using a script to generate timing driven place and route layout. The purpose of layout synthesis block 192 is to produce realistic physical constraints which can be incorporated into the RTL model development process. Layout synthesis may be used in order to track the RTL development progress against the area, power and speed targets. The layout synthesis block 192 may be the responsibility of the implementation team and may provide as deliverables standard delay files and DFT, area, frequency and power consumption information to assist the RTL development and verification process of block 188.

The cell timing model block 194 uses information from the standard cell library block 104 and the custom cell library block 162 to develop cell timing models which are supplied to blocks 190 and 192. This information is used in the timing analysis and in layout synthesis.

Following test generation block 186, a determination is made in step 200 as to whether the RTL quality criteria are met by the current revision of the RTL model. If the RTL quality criteria are not met, appropriate revisions are made and the tests are repeated in block 186. When the RTL quality criteria are met in step 200, a final or "golden" RTL model is designated in block 202. The golden RTL model 202 is the chip model used by the product implementation team to implement the chip design in silicon.

The chip integration process illustrated in the bottom row of FIG. 1 is based entirely on the golden RTL model 202 and is otherwise separate from the chip development process described above. The chip integration process involves chip floorplanning in block 220, chip integration and standard delay file extraction in block 222, physical verification in block 224 and tapeout in block 226. Silicon debug and validation in block 230 may provide feedback to test generation block 186 for correcting problems found in the chip integration process.

It may be noted that the golden RTL model 202 may be developed with specific input from the chip integration process with respect to processes, layouts and other techniques utilized in the chip integration process. Thus, the development of the golden RTL model 202 may be a joint development effort of two or more companies or other development entities using a minimum and specific set of shared information. The chip integration process may be implemented by one or both of the companies or by a third party entirely separately from the joint effort and without sharing information concerning processes, layouts and other aspects of chip integration. The process thus provides a method for conducting a joint chip development while protecting proprietary information of the participants in the joint development effort.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A method for developing an integrated circuit chip design, comprising the steps of:
   (a) developing an architecture specification defining functions of the chip;
   (b) developing a microarchitecture specification for the chip based on the architecture specification;
   (c) developing a functional and structural model of the chip based on the microarchitecture specification;
   (d) designing software application tools for the chip based on the architecture specification;
   (e) designing chip verification tools for verifying the operation of the chip based on the microarchitecture specification; and
   (f) performing steps (c), (d) and (e) concurrently.

2. A method as defined in claim 1 wherein each of steps (c), (d) and (e) includes a planning phase, a building block development phase and an execution phase.

3. A method as defined in claim 2 wherein each of the phases has defined dependencies and defined deliverables.

4. A method as defined in claim 1 further comprising the step of:
   (g) developing an information database containing information on the development of the chip, step (g) being performed concurrently with steps (c), (d) and (e).

5. A method as defined in claim 4 wherein the information database includes project tracking information and revision control information.

6. A method as defined in claim 4 wherein the information database is web-based.

7. A method as defined in claim 1 wherein step (c) includes analyzing signal timing on the chip.

8. A method as defined in claim 1, wherein step (c) includes analyzing power consumption by the chip.

9. A method as defined in claim 1 wherein step (c) includes analyzing the chip area occupied by elements of the chip.

10. A method as defined in claim 1 wherein step (c) includes developing a software model of the chip.

11. A method as defined in claim 1 further comprising the step of using the chip verification tools designed in step (e) to verify the functional and structural model of the it chip.

12. A method as defined in claim 11 when the step of using the chip verification tools is performed iteratively following modifications to the functional and structural model of the chip.

13. A method as defined in claim 1 further comprising the step of developing a library of standard cells for use in the chip.

14. A method as defined in claim 1 further comprising the step of developing a library of custom cells for use in the chip.

15. A method as defined in claim 11 wherein the step of developing a software model of the chip includes debugging the software model of the chip in response to results produced by the verification tools.

16. A method as defined in claim 1 wherein steps (a)–(f) are implemented for developing a digital signal processor computation core.

17. A method as defined in claim 1 wherein step (c) includes synthesizing a chip layout to assist in developing the functional and structural model of the chip.

* * * * *

UNITED STATES PATENT AND TRADEMARK OFFICE
CERTIFICATE OF CORRECTION

PATENT NO.    : 6,526,562 B1
DATED         : February 25, 2003
INVENTOR(S)   : Haddad et al.

It is certified that error appears in the above-identified patent and that said Letters Patent is hereby corrected as shown below:

<u>Column 9,</u>
Line 16, please delete the word "it".

Signed and Sealed this

Eighth Day of April, 2003

JAMES E. ROGAN
*Director of the United States Patent and Trademark Office*